(12) United States Patent
Gregor et al.

(10) Patent No.: US 6,661,121 B2
(45) Date of Patent: Dec. 9, 2003

(54) PULSE GENERATOR WITH CONTROLLED OUTPUT CHARACTERISTICS

(75) Inventors: Roger P. Gregor, Endicott, NY (US); Eugene J. Nosowicz, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 09/955,772

(22) Filed: Sep. 19, 2001

(65) Prior Publication Data

US 2003/0052546 A1 Mar. 20, 2003

(51) Int. Cl.$^7$ ................................................. H03K 3/00
(52) U.S. Cl. ...................... 307/106; 327/164; 327/227
(58) Field of Search .......................... 307/106; 327/164, 327/165, 166, 227, 230, 291

(56) References Cited

U.S. PATENT DOCUMENTS

| | | |
|---|---|---|
| 3,949,384 A | 4/1976 | Lohmann |
| 4,293,780 A | 10/1981 | Roesler |
| 5,280,203 A | 1/1994 | Hung et al. |
| 5,406,134 A | 4/1995 | Menut |
| 5,465,060 A | 11/1995 | Pelella |
| 5,742,192 A * | 4/1998 | Banik .......................... 327/166 |
| 5,767,718 A | 6/1998 | Shih |
| 6,495,995 B2 * | 12/2002 | Groom et al. .............. 323/283 |

* cited by examiner

Primary Examiner—Gregory J. Toatley, Jr.
Assistant Examiner—Robert L DeBeradinis
(74) Attorney, Agent, or Firm—Arthur J. Samodovitz

(57) ABSTRACT

A pulse generation circuit delivers an output pulse whose width is tailored to the load. The pulse generation circuit comprises the following components. A drive circuit has an input coupled to receive a clock signal and an output coupled to drive a load. A comparator has an input coupled to the output of the drive circuit. Another input of the comparator is supplied by a reference voltage. A feedback circuit comprises logic gates and is coupled between the output of the comparator and the input of the drive circuit. The feedback circuit terminates a pulse output from the drive circuit when the pulse voltage output from the drive circuit exceeds the reference voltage. The reference voltage is higher than a voltage required to trigger the logic gates and a voltage required to drive the load. This ensures that the load is driven adequately over a wide range of load currents and capacitances. By setting the reference voltage between the voltage required to drive the load and the supply voltage, the pulse width is not excessive.

11 Claims, 6 Drawing Sheets

PULSE GENERATOR WITH CONTROLLED OUTPUT CHARACTERISTICS

BACKGROUND OF THE INVENTION

The invention relates generally to clock pulse generation circuits and deals more particularly with a clock pulse generation circuit with a controlled output to reduce pulse width yet satisfy a wide range of loads.

Master/slave flip-flops are well known in the industry. Typically, the master latch is set with one clock pulse and the input data is transferred to the slave latch using a subsequent independent clock pulse. One shortcoming of this arrangement is the need for two separate clock signals. This may require two separate clocks and will require two circuit lines to deliver the two, nonoverlapping clock signals to the flip-flop. In very fast circuits, care must be taken to ensure that the two circuit lines have similar length so that the two clock signals arrive at the flip-flop in proper timed relation. Alternately, delay circuits can be added to compensate for differences in the length of the circuit lines for the two clock signals. Nevertheless, even if the clock signals arrive at the pre-determined time, this arrangement does not take into account differences in load. With a large load, i.e. substantial current drain and capacitance, the voltage of the pulse will rise gradually, and a longer pulse width will be required to allow the pulse to rise to an effective voltage level to drive the load. Conversely, with a small load, a shorter pulse width will be adequate.

It was also known in master/slave flip-flops to maintain the clock input to the slave latch active and pulse the clock line of the master. This eliminates the balancing of the master and slave latch clock distribution networks and reduces power consumption. However, care must be taken to control the shape of input clock pulse to the master latch. In the prior art, the clock pulse output from the master/slave flip-flop was generated without regard to the electrical characteristics of the network that it feeds.

A simplified version of a single clock, pulse generation circuit generally designated 6 is shown in FIG. 1 (labelled as "Prior Art"). Initially, a clock signal 8 is in the steady-state low condition, the output of inverter 14 is high and the output of delay circuit 16 is high. Because of the clock signal being low, the output of nand gate 10 is high and the output of inverter/driver 12 is low. Then, to initiate a pulse output from inverter/driver 12, the clock signal 8 goes high. At this instant the output of delay circuit 16 is still high, so the output of nand gate 10 momentarily goes low and the output of inverter/driver 12 momentarily goes high to initiate the desired output pulse. A short time later, the high level of the clock signal 8 passes through the inverter 14 and the delay circuit 16 to apply a low level to the input of nand gate 10. This causes the nand gate 10 to output a high level again and the output of inverter/driver 12 to output a low level again. Thus, the duration of the output pulse from inverter/driver 12 is determined by the propagation delay through inverter 14 and delay 16. While this arrangement operates from a single clock signal, the output pulse width is fixed and is not tailored to the load.

Accordingly, an object of the present invention is to provide a flip-flop or pulse generation circuit which is driven by a single clock signal and has a pulse width tailored to the load.

SUMMARY OF THE INVENTION

The invention resides in the following pulse generation circuit having a tailored output pulse. A drive circuit has an input coupled to receive a clock signal and an output coupled to drive a load. A comparator has an input coupled to the output of the drive circuit. Another input of the comparator is supplied by a reference voltage. A feedback circuit comprises logic gates and has an input coupled to an output of the comparator. An output of the feedback circuit is coupled to another input of the drive circuit to terminate a pulse output from the drive circuit when a voltage output from the drive circuit exceeds the reference voltage. The reference voltage is higher than a voltage required to trigger the logic gates and a voltage required to drive the load. This ensures that the load is driven adequately over a wide range of load currents and capacitances. By setting the reference voltage between the voltage required to drive the load and the supply voltage, the pulse width is not excessive.

DETAILED DESCRIPTION OF THE PREFERRED EMBODIMENTS

Figure 1:
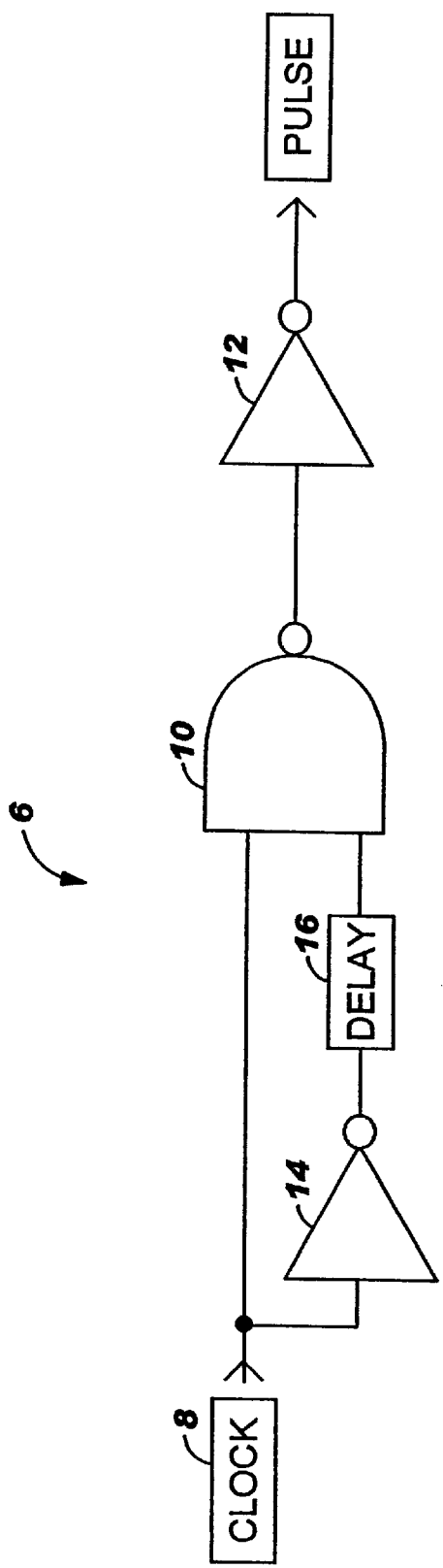
FIG. 1 is a schematic diagram of a clock generation circuit according to the prior art.
Figure 2:
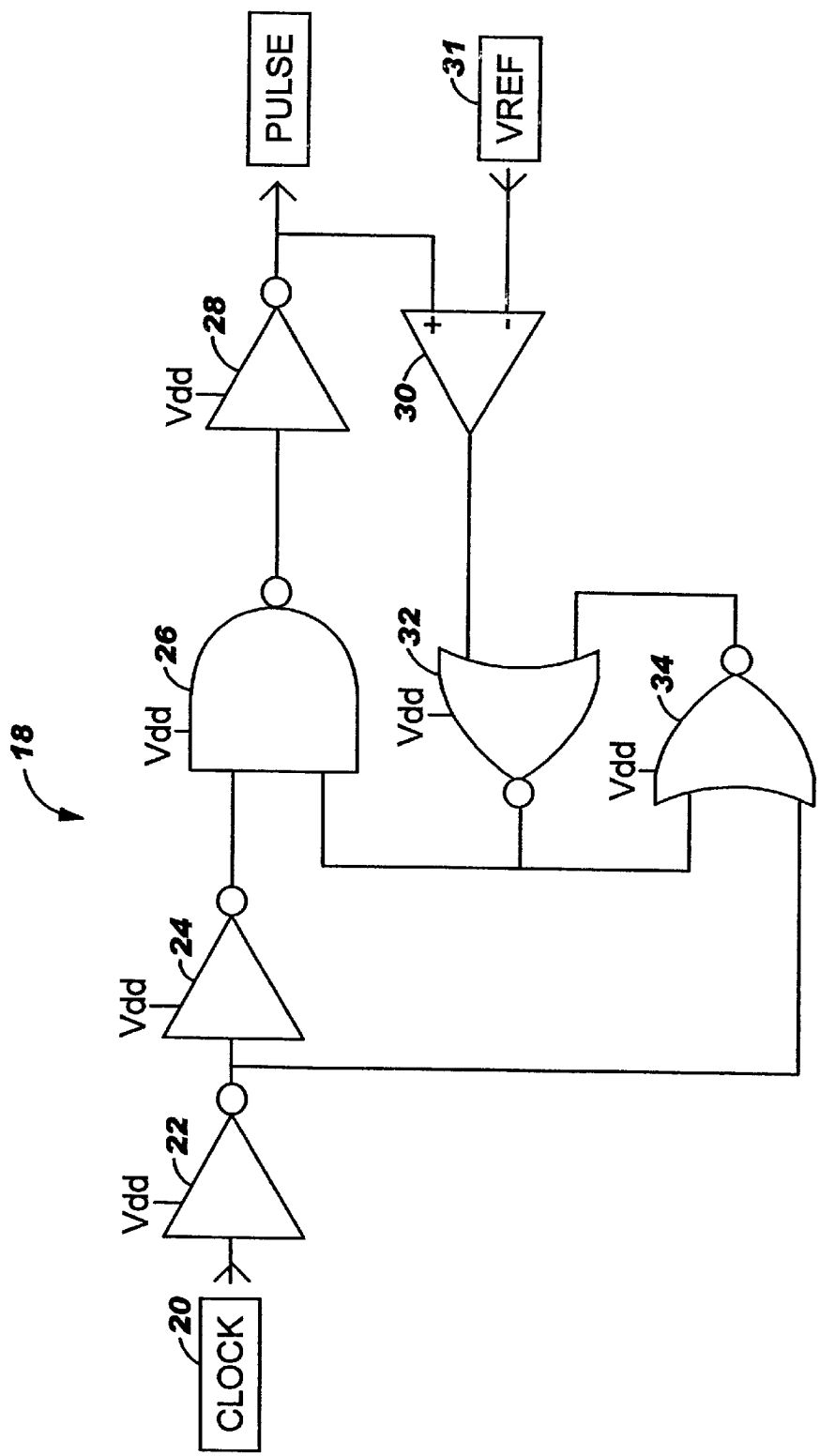
FIG. 2 is a schematic diagram of a clock generation circuit according to a first embodiment of the present invention.

Referring now to the drawings in detail, wherein like reference numbers indicate like elements throughout, FIG. 2 illustrates a clock generation circuit generally designated 18 according to a first embodiment of the present invention.

Steady-State Condition of Circuit 18

A single clock signal 20 initially applies a steady-state low level to an inverter 22. Consequently, a high level is applied to the input of another inverter 24 and the input of a nor gate 34. The output of inverter 24 is low which yields a high level at the output of nand gate 26 and a low level at the output of driver/inverter 28. The output of driver/inverter 28 is also supplied to the noninverting input of a comparator 30. The other, inverting input of comparator 30 is supplied by a reference voltage 31 which is set above the normal triggering voltage of the other gates, i.e. gates 22, 24, 26, 28, 32 and 34. For example, if these other gates are set to trigger at one half of a supply voltage Vdd, then the reference voltage 31 can be set at 60%–90% of the supply voltage, preferably 60%–70%. As explained in more detail below, this reference voltage ensures that the load is adequately driven and will tailor the width of the pulse output from inverter/driver 12 irrespective of load. This tailoring will avoid excessively long pulse widths. (If the reference voltage is set at a minimum level above the triggering voltage of the load, then the pulse width will be minimized.) Because the voltage output from inverter/driver 28 is currently low (in the steady-state condition), the output of comparator 30 will also be low and this is applied to one input of nor gate 32. The steady-state low level of clock signal 20 and corresponding high level output from inverter 22 also yield a low level at the output of nor gate 34 and the other input of nor gate 32. Consequently, the output of nor gate 32 is high; this will not change the output of nand gate 26 from its steady-state high condition because the other input of nand gate 26 is low from the steady-state low level of clock signal 20.

Generation of Tailored Output Pulse from Circuit 18

To initiate the output pulse from inverter/driver 28 of circuit 18, the clock signal 20 goes high. This yields a low at the output of inverter 22 and a high at the output of inverter 24 and an input of nand gate 26. (The output of inverter 22 also supplies a low level to one input of nor gate 34, but because the other input to nor gate 34 is still high, the output of nor gate 34 will not change at this instant.) Because the other input of nand gate 26 is still high, this will yield a temporary low at the output of nand gate 26 and a temporary high at the output of inverter/driver 28, although the output of inverter/driver does not rise to the supply voltage instantaneously. The rise time depends on the load, i.e. its current requirements, and the capacitance at the output of inverter/driver 28 and the input of the load. At some point, the output voltage will rise above the reference voltage 31 at the input of comparator 30. This ensures adequate drive voltage for the load and is the trigger to terminate the pulse output from inverter/driver 28. Thus, this output voltage level (i.e. above the reference voltage 31) will cause the output of comparator 30 to go high. The comparator output is supplied to an input of nor gate 32 which will cause its output to go low. The output of nor gate 32 is supplied to an input of nand gate 26, so nand gate 26 goes high and the output of inverter/driver 28 goes low terminating the output pulse. The low level output of nor gate 32 is also supplied to an input of nor gate 34; because the high level of clock signal 20 caused a low at the other input of nor gate 34, the output of nor gate 34 will go high, latching the output of nor gate 32 low. (Nor gates 32 and 34 form a latch.) Thus, nand gate 26 will remain high and the output of inverter/driver 28 will remain low even though the clock signal 20 remains high for the remainder of its duty cycle. Consequently, in accordance with the object of the present invention, the clock generation circuit 18 provides an output pulse that is adequate in voltage to drive a wide range of load currents and capacitances and whose width is tailored to the load.

Figure 3:
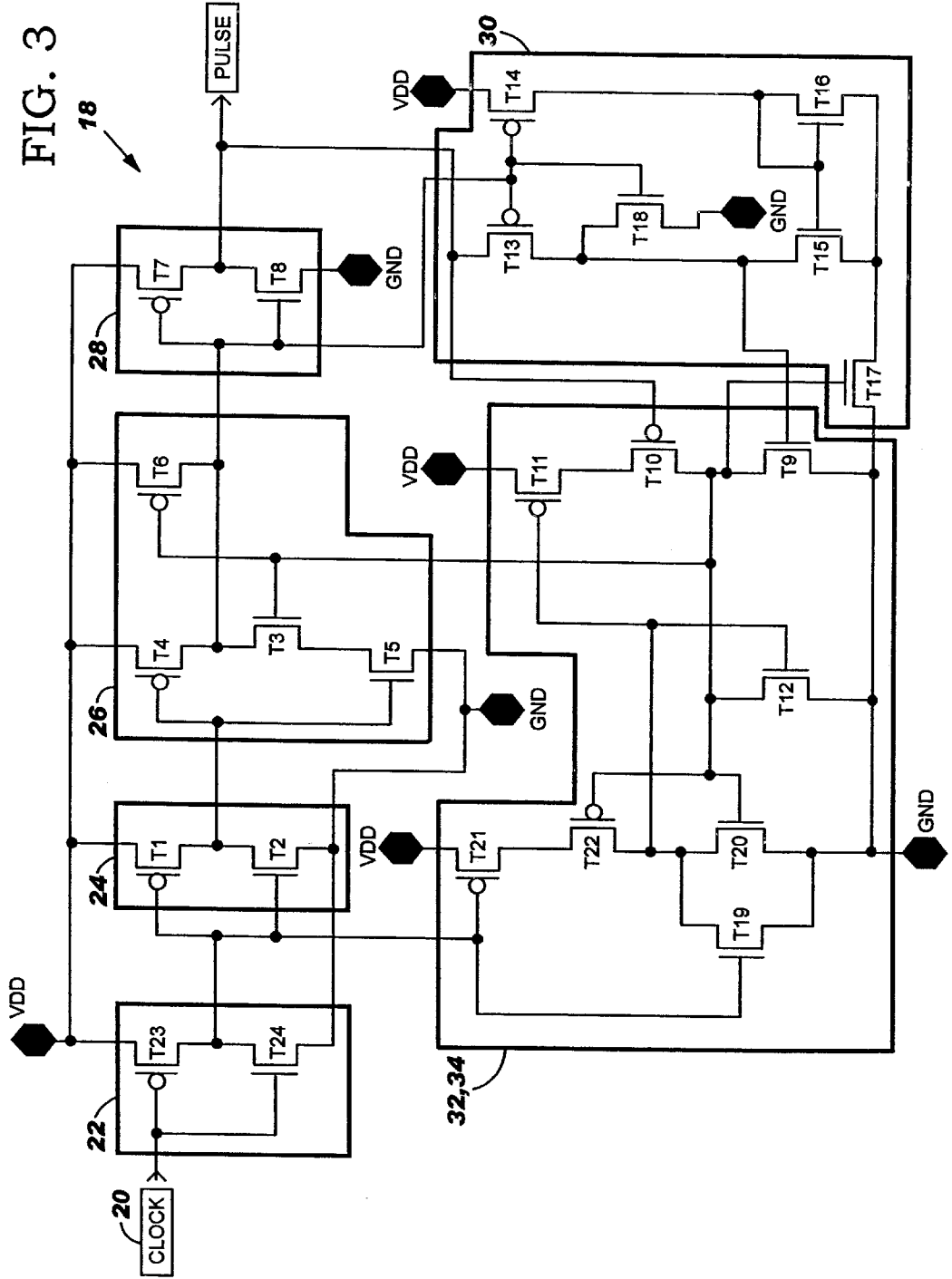
FIG. 3 is a transistor level diagram of the clock generation circuit of FIG. 2.

FIG. 3 is a more detailed, transistor level drawing of the pulse generation circuit 18. By way of example, the transistors are field effect such as MOSFETS, although other types of transistors such as bipolar and SiGe are suitable also. Inverter 22 comprises transistors T23 and T24. Inverter 24 comprises transistors T1 and T2. Nand gate 26 comprises transistors T3–T6. Inverter 28 comprises transistors T7 and T8. The latch formed by nor gates 32 and 34 comprises transistors T9–T12 and T19–T22. Comparator 30 comprises transistors T13–T18. The reference voltage 31 is formed by a switch current mirror comprised of transistors T13, T14, T15, T16 and T18. When the clock signal 20 is in the steady-state low level, the output of nand gate 26 is high, and transistors T13 and T14 of comparator 30 are turned off. Thus, current is prevented from flowing through transistors T15 and T16 which form a current mirror. At the same time, transistor T18 holds the output of comparator 30 low which holds the input to transistor T9 low and the input to transistor T10 is held high. This allows nor latch 32,34 to be set to a high level. Because the output of nor gate 32 is set high, transistor T17 is enabled in preparation for comparator 30 turning on. When the clock signal 20 goes high, the output of nand gate 26 goes low, turning off transistor T18 and turning on transistors T13 and T14. Initially, while the inverter/driver 28 output is low, the current through transistor T14 is greater than the current through transistor T13. Because the current through transistor T14 is mirrored through transistor T16 into the drain of transistor T15, the current through transistor T15 is greater than the drain current of transistor T13, so the comparator 30 output remains low. Transistor T13 is sized to provide more current than transistor T14 for the same source voltage, so that at some point below the supply voltage, the current through transistor T13 exceeds that of transistor T15, and the comparator 30 output rises, turning on transistor T9. As the drain voltage of transistor T9 decreases, transistor T17 turns off, creating positive feedback to turn on transistor T9 more quickly, and also to remove the comparator bias current to reduce power. The fall of the drain voltage of transistor T9 (output of nor gate 32) both shuts off the driver/inverter 28 output and resets nor latch 32,34, so that another driver/output 28 pulse cannot occur until the clock signal has gone low again to set the nor latch 32,34.

Figure 4:
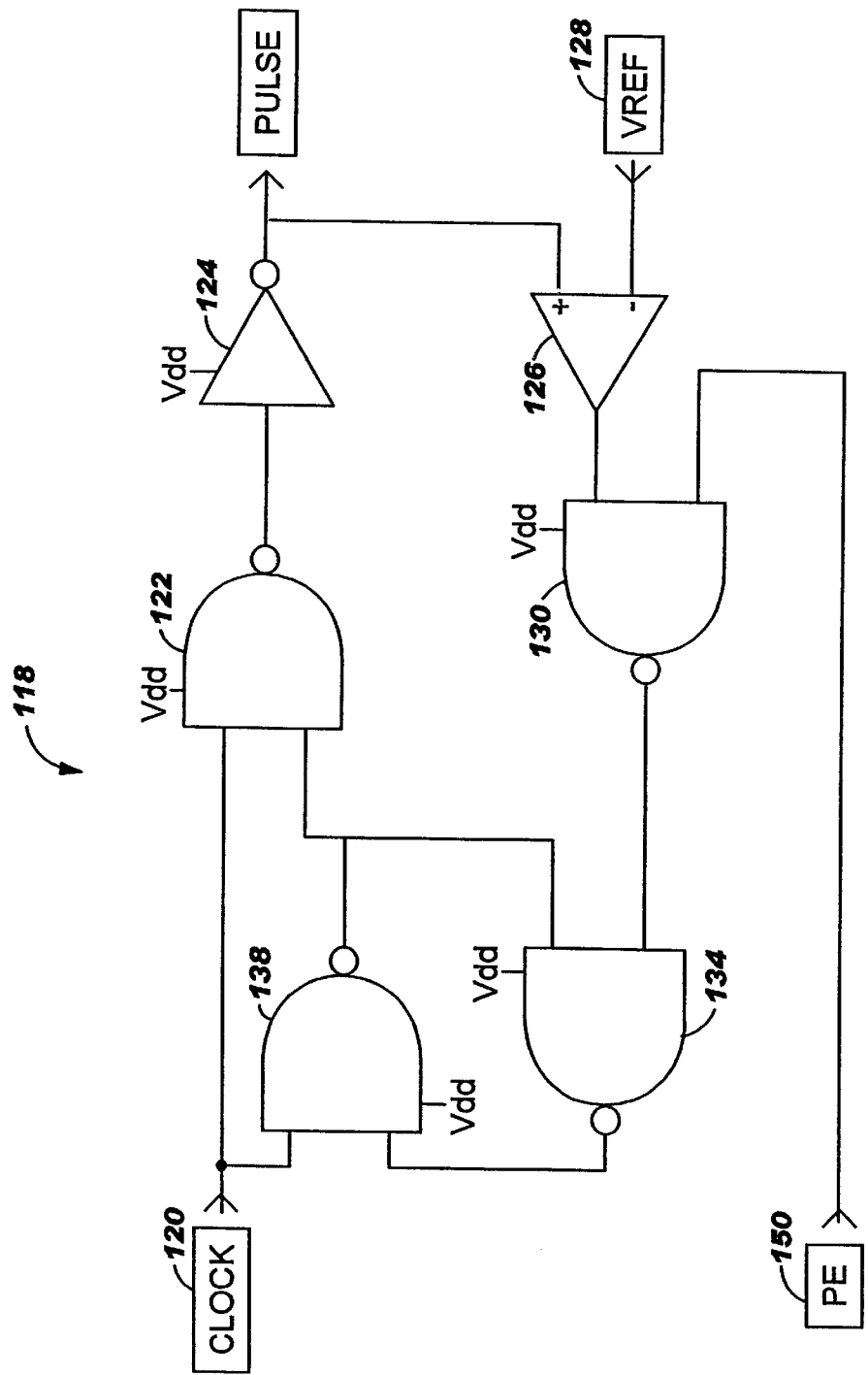
FIG. 4 is a schematic diagram of another clock generation circuit according to another embodiment of the present invention.

FIG. 4 illustrates a clock generation circuit generally designated 118 according to a second embodiment of the present invention. Circuit 118 performs the same general function as circuit 18 except that circuit 118 also includes an output pulse enable feature as described below.

Steady-State Condition of Circuit 118

A clock signal 120 initially applies a steady-state low level to an input of nand gate 122. As a result, the output of nand gate 122 is high and the output of inverter/driver 124 is low. The steady-state low level of the clock signal 120 fixes the output of the inverter/driver 124 to be low irrespective of the states of the other components in circuit 118. Nevertheless, the states of the other components of circuit 118 impact subsequent operation, so their current states are explained as follows. Circuit 118 includes a comparator 126 with a reference voltage 128 set to a voltage level between 60% and 90% of the supply voltage, Vdd, preferably about 70%. The reference voltage is applied to the inverting input of comparator 126. The output of inverter/driver 124 is also supplied to the noninverting input of comparator 126, so the output of comparator 126 during the steady-state condition is low. This output is supplied to an input of nand gate 130 which causes the output of nand gate 130 to be high. The steady-state low level of the clock signal 120 is also supplied to an input of nand gate 138 which causes the output of nand gate 138 to be high. Thus, both inputs to nand gate 134 are high and the output of nand gate 134 is low during this steady-state condition. (Nand gates 134 and 138 form a latch.)

Generation of Tailored Output Pulse from Circuit 118

To initiate the output pulse from inverter/driver 124 of circuit 18, the clock signal 120 goes high. This high level is applied to one input of nand gate 122. The other input is supplied by the output of nand gate 138 which at this instant is high also. Consequently, the output of nand gate 122 temporarily goes low and the output of inverter/driver 124 temporarily goes high, although the output of inverter/driver 124 does not rise to the supply voltage instantaneously. The rise time depends on the load, i.e. its current requirements, and the capacitance at the output of inverter/driver 124 and the input of the load. At some point, the output voltage will rise above the reference voltage 128 at the inverting input of comparator 126. This ensures adequate drive voltage for the load and is the trigger to terminate the pulse output from inverter/driver 124. Thus, this output voltage level will also cause the output of comparator 126 to go high. The comparator output is supplied to the input of nand gate 130. Assuming the circuit 118 is enabled by a high level from "pulse enable" signal 150, the output of nand gate 130 will go low which will cause the output of nand gate 134 to go high. The high level output of nand gate 134 is applied to one input of nand gate 138, the other input being supplied by the clock signal 120 which is high. Thus, the output of nand gate 138 goes low, and this is applied to an input of nand gate 122. The low input causes nand gate 122 to output a high level and the inverter/driver 124 to output a low level terminating the pulse. Because of the latching function of nand gates 134 and 138, one input to nand gate 122 will remain low, the output of nand gate 122 will remain high and the output of inverter/driver 28 will remain low even though the clock signal 120 remains high for the remainder of its duty cycle. Consequently, in accordance with the object of the present invention, the clock generation circuit 118 provides an output pulse that is adequate to drive a wide range of load currents and capacitances and whose width is tailored to the load.

Figure 5:
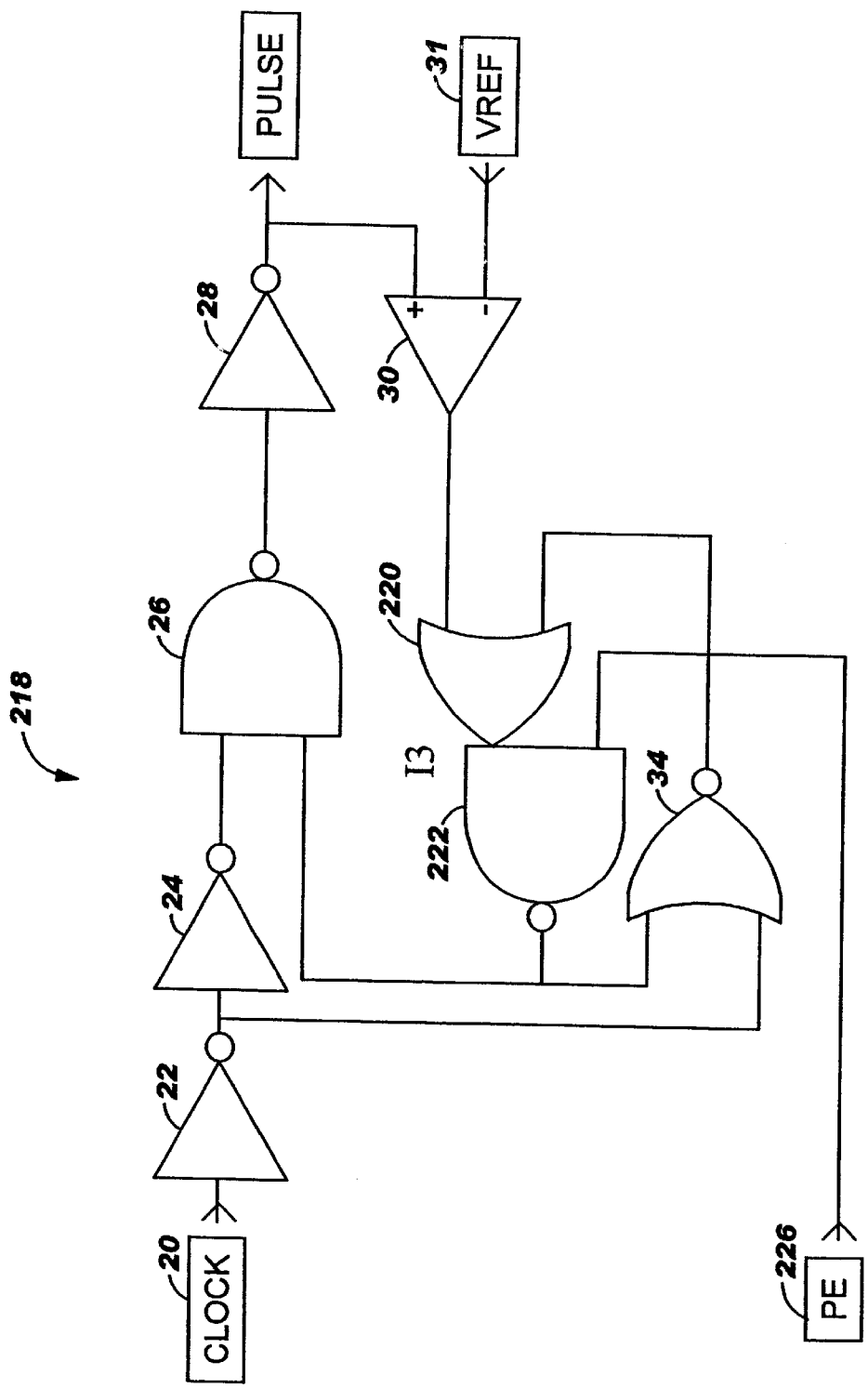
FIG. 5 is a schematic diagram of yet another clock generation circuit according to yet another embodiment of the present invention.

FIG. 5 illustrates a clock generation circuit generally designated 218 according to a third embodiment of the present invention. Circuit 218 is identical to circuit 18 except that circuit 218 substitutes an or gate 220 and a nand gate 222 for the nor gate 32 of circuit 18 and also includes a pulse enable signal 226 that supplies an input of nand gate 222. Otherwise gates 34, 220 and 222 of circuit 218 perform the same latching function as nor gates 32 and 34 of circuit 18.

Figure 6:
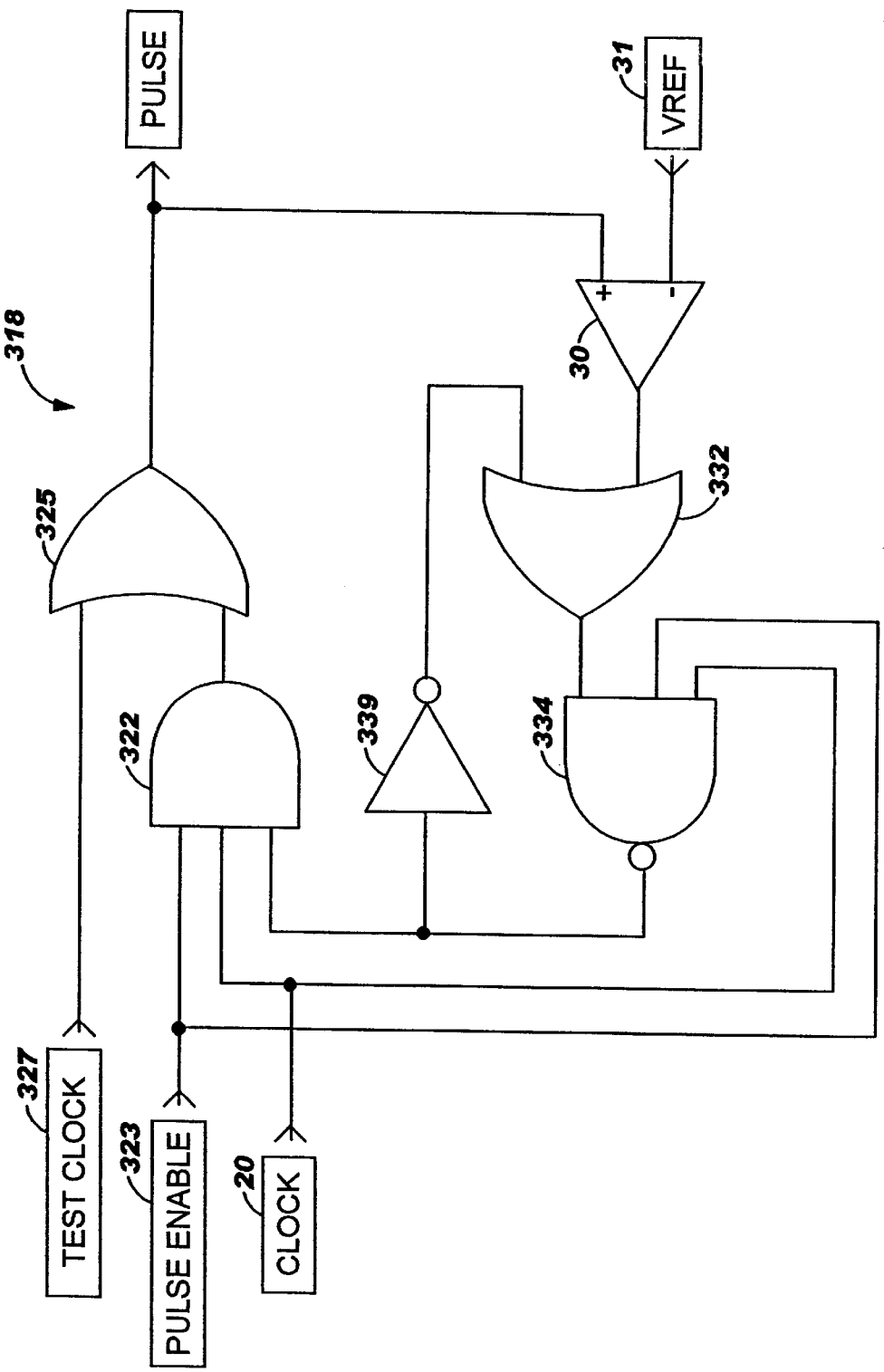
FIG. 6 is a schematic diagram of still another clock generation circuit according to still another embodiment of the present invention.

FIG. 6 illustrates a clock generation circuit generally designated 318 according to a fourth embodiment of the present invention.

Steady-State Condition of Circuit 318

A clock signal 20 initially applies a steady-state low level to an and gate 322. If a pulse enable signal 323 is also high, a high level is applied from the output of and gate 322 to the input of an or gate 325. Assuming a test clock signal 327 is currently low, there will be a low level at the output of or gate 325 which furnishes the output of circuit 318. The output of or gate 325 is also supplied to the noninverting input of a comparator 30. The inverting input of comparator 30 is supplied by a reference voltage 31 which is set above the normal triggering voltage of the other gates, i.e. gates 322, 325,332, 334 and 339. For example, if these other gates are set to trigger at one half the supply voltage Vdd, then the reference voltage 31 can be set at 60%–90% of the supply voltage, preferably 60%–70%. As explained in more detail below, this reference voltage ensures that the load is adequately driven and will tailor the width of the pulse output from inverter/driver 12 irrespective of load. Because the voltage output from or gate 325 is currently low, the output of comparator 30 will also be low and this is applied to one input of or gate 332. Because the clock signal 20 is low during the steady-state condition, the output of a nand gate 334 is high. This high level is also applied to an input of inverter 339. Consequently, the output of inverter 339 is low and this is applied to another input of or gate 332. Gates 332, 334 and 339 thus form a latch.

Generation of Tailored Output Pulse from Circuit 318

To initiate the output pulse from or gate 325 of circuit 318, the clock signal 20 goes high. This yields a temporary high at the output of and gate 322 and a temporary high at the output of or gate 325, although the output of or gate 325 does not rise to supply voltage level instantaneously. (The clock signal 20 also supplies a high level to one input of nand gate 334, but because another input of nand gate 334 is still low, the output of nand gate 334 will not change at this instant.) The rise time of the output of or gate 325 depends on the load, i.e. its current requirements, and the capacitance at the output of or gate 325 and the input of the load. At some point, the output voltage will rise above the reference voltage 31 at the input of comparator 30. This ensures adequate drive voltage for the load and is the trigger to terminate the pulse output from or gate 325. Thus, this output voltage level will also cause the output of comparator 30 to go high. The comparator output is supplied to an input of or gate 332 which will cause its output to go high. The high level output of or gate 332 is supplied to an input of nand gate 334. Another input of nand gate 334 is now supplied by the high level clock signal. (The final input to nand gate 334 is still high due to the high level of the pulse enable signal.). So, the output of nand gate 334 goes low. This low level is applied to an input of and gate 322, so the output of and gate 322 goes low. Assuming the test clock signal is still low, the output of or gate 325 goes low, terminating the output pulse. The high level output from nand gate 334 is also applied to the input of inverter 339. Consequently, the output of inverter 339 is high, an input to or gate 332 is high and the output of or gate 332 is high. This latches nand gate 334 with an output level of low to keep the outputs of and gate 322 and or gate 325 low during the remainder of the clock signal pulse. Consequently, in accordance with the object of the present invention, the clock generation circuit 318 provides an output pulse that is adequate to drive a wide range of load currents and capacitances and whose width is tailored to the load.

During a test mode, test clock signal 327 is high, and the output from or gate 325 is high.

Based on the foregoing, pulse generation circuits according to the present invention have been disclosed. However, numerous modifications and substitutions can be made without deviating from the scope of the present invention. Therefore, the invention has been disclosed by way of illustration and not limitation and reference should be made to the following claims to determine the scope of the invention.

We claim:

1. A pulse generation circuit comprising:
a drive circuit having an input coupled to receive a clock signal and an output coupled to drive a load;
a comparator having an input coupled to the output of said drive circuit, another input of said comparator being supplied by a reference voltage;
a feedback circuit, comprising logic gates, having an input coupled to an output of said comparator and an output coupled to another input of said drive circuit, to terminate a pulse output from said drive circuit when a voltage output from said drive circuit exceeds said reference voltage; and
wherein said reference voltage is higher than a voltage required to trigger said logic gates and a voltage required to drive said load.

2. A pulse generation circuit as set forth in claim 1 wherein said reference voltage is selected to tailor a width of said pulse output from said load driver.

3. A pulse generation circuit as set forth in claim 1 wherein said drive circuit comprises one or more logic gates.

4. A pulse generation circuit as set forth in claim 2 wherein said feedback circuit includes a latch whose output is coupled to an input of said drive circuit.

5. A pulse generation circuit as set forth in claim 4 wherein said latch is configured to be set by said clock signal and reset when said output pulse exceeds the reference voltage of said comparator.

6. A method for generating a pulse having a width tailored to a load, said method comprising the steps of:

supplying a clock signal to an input of a drive circuit, said drive circuit having an output coupled to drive said load;

comparing an output of said drive circuit to a reference voltage;

terminating a pulse output from said drive circuit when a voltage output from said drive circuit exceeds said reference voltage; and wherein said reference voltage is higher than a voltage required to drive said load and a voltage required to trigger logic gates used to perform the terminating step.

7. A method as set forth in claim 6 wherein said terminating step is performed by a feedback circuit which comprises said logic gates.

8. A method as set forth in claim 7 wherein said feedback circuit has an input coupled to an output of the comparing step and an output coupled to another input of said drive circuit, to terminate said pulse output from said drive circuit when said voltage output from said drive circuit exceeds said reference voltage.

9. A method as set forth in claim 8 wherein said feedback circuit includes a latch whose output is coupled to an input of said drive circuit, said latch is set by said clock signal and reset when said output pulse exceeds said reference voltage.

10. A pulse generation circuit comprising:

a drive circuit having an input coupled to receive a clock signal and an output coupled to drive a load;

a comparator having an input coupled to the output of said drive circuit, another input of said comparator being supplied by a reference voltage;

a feedback circuit, comprising transistors arranged into logic gates, having an input coupled to an output of said comparator and an output coupled to another input of said drive circuit, to terminate a pulse output from said drive circuit when a voltage output from said drive circuit exceeds said reference voltage; and wherein said reference voltage is higher than a voltage required to trigger said logic gates and a voltage required to drive said load.

11. A pulse generation circuit as set forth in claim 10 wherein said output of said drive circuit has a same voltage as said load.

* * * * *